United States Patent [19]

Dutta et al.

[11] 4,456,490
[45] Jun. 26, 1984

[54] LASER ANNEALING OF MIS DEVICES BY BACK SURFACE LASER TREATMENT

[75] Inventors: Subhadra Dutta, Wilkins Township, Allegheny County; Prosenjit Raichoudhury, Franklin, both of Pa.

[73] Assignee: Westinghouse Electric Corp., Pittsburgh, Pa.

[21] Appl. No.: 473,429

[22] Filed: Mar. 9, 1983

[51] Int. Cl.³ .................... H01L 21/263; B23K 27/00
[52] U.S. Cl. .................. 148/1.5; 29/576 B; 29/576 T; 148/187; 357/23.5; 427/53.1
[58] Field of Search ............ 148/1.5, 187; 29/576 B, 29/576 T; 427/53.1; 357/23 VT, 357

[56] References Cited

U.S. PATENT DOCUMENTS 4,116,721  9/1978  Ning et al. ........................ 148/1.5
4,319,119  3/1982  Runge ............................... 148/1.5

OTHER PUBLICATIONS

Celler et al., J. Appl. Phys. 50 (Nov. 1979) 7264.
Iwamatsu et al., J. Electrochem. Soc. 128 (1981) 384.
Lysenko et al., Phys. Stat. Solidi. 49a (1978) 405.
Kamins et al., Solid St. Electronics, 23 (1980) 1037.

Primary Examiner—Upendra Roy
Attorney, Agent, or Firm—W. E. Zitelli

[57] ABSTRACT

A process for fabricating metal-insultor-semiconductor integrated circuits, especially the processing step of annealing a fabricated wafer by passing a laser beam through the semiconductor wafer from the back surface thereof to the semiconductor-insulator interface to effect localized heating of the insulator at the semiconductor-insulator interface, is disclosed. More particularly, the laser beam is of a wavelength which makes the semiconductor wafer substantially transparent and the insulator substantially absorbent to the laser beam. Moreover, since the illuminating area of the laser beam may be substantially smaller than the surface area of the semiconductor-insulator interface, the laser beam may be scanned across the surface area of the interface to effect an overall annealing thereof.

7 Claims, 6 Drawing Figures

LASER ANNEALING OF MIS DEVICES BY BACK SURFACE LASER TREATMENT

BACKGROUND OF THE INVENTION

The present invention relates generally to a process for fabricating metal-insulator-semiconductor (MIS) integrated circuits, and more particularly, to the processing step of annealing a fabricated wafer by passing a laser beam through the semiconductor wafer from the back surface thereof to the semiconductor-insulator interface to effect localized heating of the insulator at the semiconductor-insulator interface, the laser beam being of a wavelength which makes the semiconductor wafer substantially transparent and the insulator substantially absorbent to the laser beam.

In the process for fabricating metal-insulator-semiconductor integrated circuits, such as metal-oxide-semiconductors (MOS) and metal-nitride-oxide-semiconductors (MNOS), for example, much attention is paid to the semiconductor-insulator interface because the characteristics of such devices are strongly dependent on the properties of this interface. It is well known that during the fabrication process, interface states and fixed oxide charge are formed at the semiconductor-insulator interface primarily in the insulator material. The presence of the interface states have a tendency to degrade the transconductance and sub-threshold behavior of the transistors of the integrated circuit, while the fixed oxide charge is known to change the threshold voltages thereof. An annealing step is generally performed during the fabrication process to reduce the effects of the interface states and fixed oxide charge.

Capacitance-voltage (CV) curves are used to determine the density of the interface states and the amounts of fixed oxide charge present at the interface. The CV curves may be generated by applying a potential across the semiconductor-insulator interface and varying the voltage in a periodic sawtooth fashion from say $-10$ volts to $+10$ volts, for example, at a frequency commensurate with the amount of capacitance present. Curves 10 and 12 in FIG. 1A are exemplary of low frequency and high frequency CV curves, respectively, developed from a semiconductor-insulator interface. The difference between the capacitance measured between the high frequency and low frequency curves 10 and 12, respectively, at $-V_G$ min. is representative of the density of the interface states, denoted by $N_{st}$. In addition, the shift of the curves 10 and 12 from the ordinate of the graph is a measure of the fixed oxide charge present at the interface, denoted by Qss. The effects of an ideal annealing step is shown by the curves 10' and 12' in FIG. 1B. In the optimum, the annealing step causes the CV curves 10' and 12' to come together at $-V_G$ min. and shifts the curves 10' and 12' closer to the ordinate of the graph which in effect illustrates a substantial reduction in both the density of the interface states and the amount of fixed oxide charge present at the interface.

Conventional furnace annealing techniques in which a fabricated wafer is disposed in a furnace at elevated temperatures for a period of time for improving the interface quality thereof has certain inherent shortcomings, as, for example, stresses caused by differential thermal expansion due to the difference in materials at the semiconductor-insulator interface. In addition, since most of the semiconductor wafers are doped silicon, heating of the silicon during the annealing step may cause undesirable changes in the dopant profile thereof. Furthermore, in most instances, the furnace annealing step is performed before the device is metallized. The subsequent metallization step required to complete the fabrication of the wafer may degrade any benefits gained from the interface annealing step.

Experimentation has been performed with other annealing techniques, such as annealing with an argon (Ar+) laser beam, for example, with promising results being reported. In the Ar+ laser annealing of MOS devices, a laser beam is passed through the insulator from the top or front surface thereof to the interface between the insulator and semiconductor materials. The Ar+ laser beam is of such a wavelength to be transmitted through the insulator layer, which may be $SiO_2$, for example, and absorbs strongly in the underlying silicon wafer. One drawback of this annealing process is that it must be performed prior to the metallization step in the fabrication process, otherwise there will be laser beam reflections from the metal circuit paths on the front surface of the fabricated wafer. Another drawback of the Ar+ laser beam annealing is that the energy of the laser beam is absorbed strongly in the silicon which may cause undesirable heating effects in the silicon resulting in the redistribution of dopant impurities which should be avoided, if possible.

From the above, it can be appreciated that while the present and promising annealing techniques perform the function intended adequately, they do have their shortcomings. Thus, it is preferred to keep the better qualities of the aforementioned annealing techniques while eliminating most if not all of their shortcomings. The annealing method described herebelow in a preferred embodiment is felt to accomplish these goals.

SUMMARY OF THE INVENTION

A fabricating process for metal-insulator-semiconductor integrated circuits includes the steps of forming an insulator layer on one surface of a doped semiconductor wafer rendering a semiconductor-insulator interface therebetween, and forming metallic circuit paths on the top surface of the insulator layer. In accordance with the present invention, thereafter the process further includes the step of annealing the fabricated wafer by passing a laser beam through the semiconducor wafer from the back surface thereof to the semiconductor-insulator interface. The laser beam is of a wavelength which makes the semiconductor wafer substantially transparent and the insulator substantially absorbent to the laser beam to effect localized heating of the insulator at the semiconductor-insulator interface.

In the case in which the insulating layer is silicon dioxide, the fabricated wafer may be annealed by applying a $CO_2$ laser beam, which may have a wavelength of approximately 10.6 $\mu$m, to the back surface of the wafer to be passed through the silicon to silicon-oxide interface. Accordingly, the annealing step may be performed by applying either a pulsed laser beam or a continuous wave laser beam to the back surface of the wafer. Since in certain cases the illuminating area of the laser beam is substantially smaller than the surface area of the semiconductor-insulator interface, the laser beam may be scanned across the surface area of the interface to effect an annealing thereof.

DESCRIPTION OF THE PREFERRED EMBODIMENT

Figure 2:
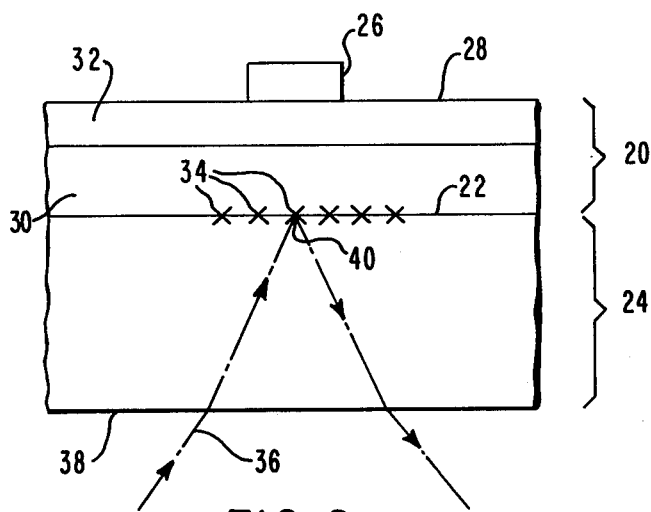
FIG. 2 is a cross-sectional illustration of a representative portion of a fabricated metal-insulator-semiconductor integrated circuit suitable for use in describing the inventive method.

FIG. 2 is a cross-sectional illustration of a representative portion of a fabricated metal-insulator-semiconductor integrated circuit. In general, the process for fabricating such a device includes the steps of: forming an insulator layer 20 on one surface 22 of a doped semiconductor wafer 24 rendering a semiconductor-insulator interface therebetween at the surface 22; and forming metallic circuit paths represented by the pad 26 on the top surface 28 of the insulator layer 20. In FIG. 2, the embodiment is one of a metal-nitride-oxide-semiconductor (MNOS) having two insulating layers one of an oxide, like silicon dioxide 30, for example, and a second layer on top thereof of silicon nitride 32. While an MNOS device is used to describe the inventive method for annealing, it is understood that other MIS devices, like an MOS device, for example, could similarly be used without deviating from the broad principles of the inventive method.

Figure 1A:
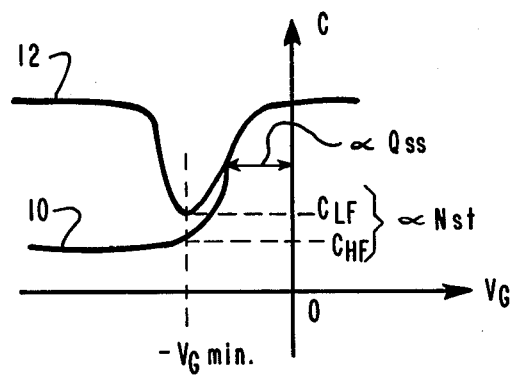
FIGS. 1A and 1B are graphical illustrations exemplary of low frequency and high frequency CV curves developed from a semiconductor-insulator interface before and after annealing, respectively.
Figure 1B:
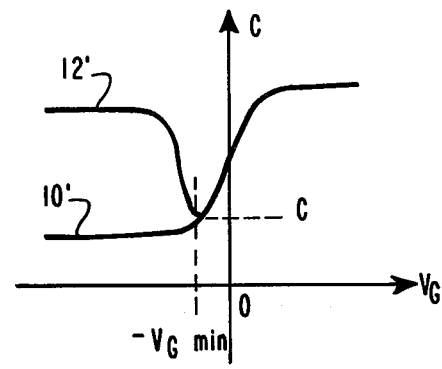

As has been described in the background section hereabove, a density of interface states and an amount of fixed oxide charge, both being represented by the X's 34, may be formed at the interface 22 primarily in the insulator layer 20. These anomalies 34 have a tendency to degrade the performance of the integrated circuits formed by the fabrication process. The annealing step of the process tends to improve the quality at the interface as exhibited by the graphical illustrations in FIGS. 1A and 1B.

In accordance with the present invention then, the fabricating process includes the step of annealing the fabricated wafer, a representative portion thereof illustratively shown in cross-sectional view in FIG. 2, by passing a laser beam, represented by the arrowed line 36, through the semiconductor wafer from the back surface 38 thereof to the semiconductor-insulator interface 22. The laser beam is of a wavelength which makes the semiconductor wafer 24 substantially transparent and the insulator 20 substantially absorbent to the laser beam 36 to effect localized heating of the insulator 20 in the region 40 at the semiconductor-insulator interface 22.

Figure 3:
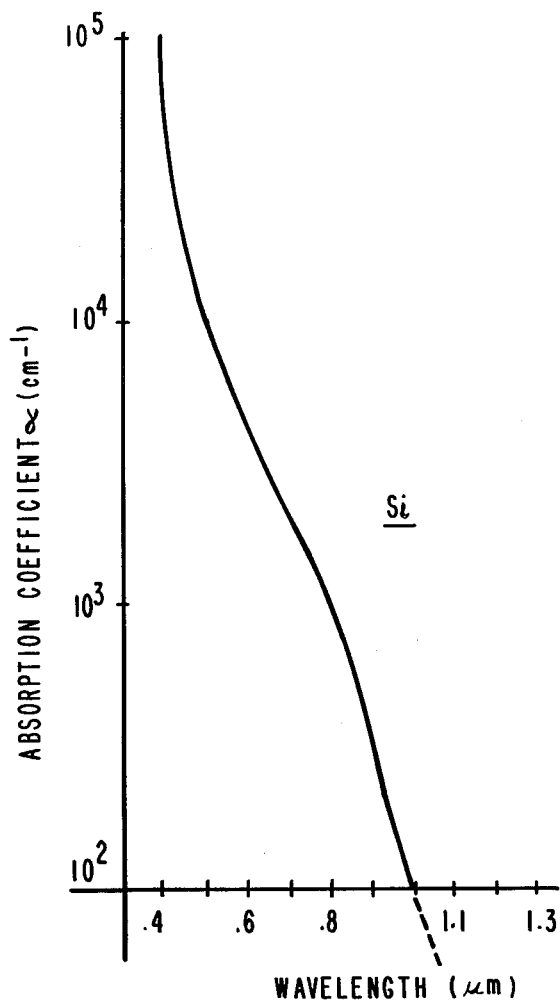
FIG. 3 is a graph illustrating the absorption characteristics of silicon with respect to the wavelength of a laser beam passing therethrough.
Figure 4:
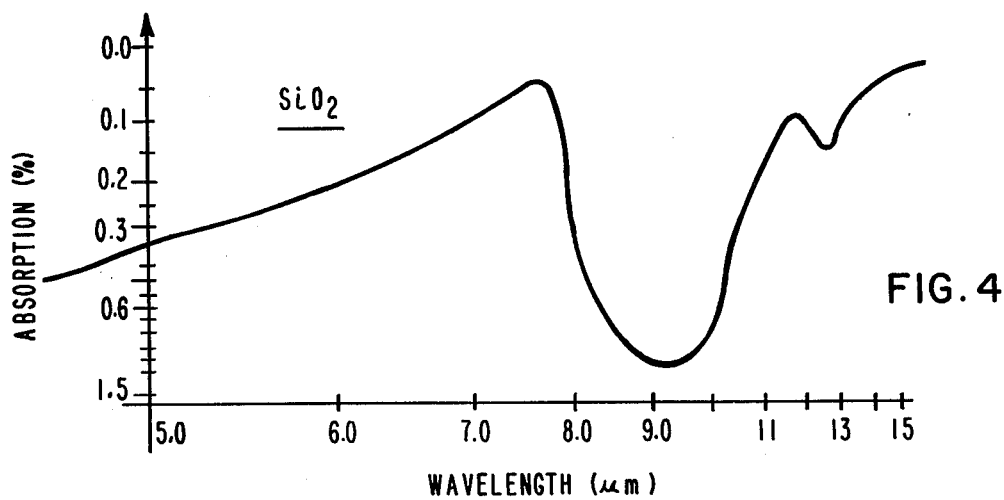
FIG. 4 is a graphical illustration of the absorption of silicon dioxide with respect to the wavelength of a laser beam passing therethrough.

To further appreciate the wavelength induced characteristics of the various materials of the fabricated wafer, reference is made to the graphs of FIGS. 3 and 4. The graph of FIG. 3 illustrates the absorption characteristics of the silicon with respect to the wavelength of a laser beam passing therethrough. It is readily recognized that the absorption of silicon diminishes at an accelerated rate with wavelengths of light greater than approximately 1 micrometer. FIG. 4, on the other hand, illustrates graphically, the absorption of an insulating material, namely silicon dioxide. Note that the absorption is maximized with wavelengths of light on the order of 9 micrometers. Thus, a silicon wafer substrate will be almost transparent to a laser beam having a wavelength on the order of 9 micrometers, while silicon dioxide and silicon nitride both absorb strongly light having a wavelength in this region.

For the present example, a $CO_2$ laser may be used with a wavelength of 10.6 micrometers in which case, the absorption coefficient of $SiO_2 = 1.19 \times 10^3$ cm$^{-1}$ and absorption coefficient of $Si_3N_4 = 4.51 \times 10^4$ cm$^{-1}$. Under these conditions, the silicon-dioxide interface at 22 as shown in FIG. 2 will be locally heated in the region 40 surrounding the $CO_2$ laser beam 36. This localized heating provided by the aforementioned laser annealing step is expected to avoid the stresses induced at the silicon-oxide interface brought on by conventional furnace annealing due to the different thermal expansion coefficients of Si and $SiO_2$.

In comparison with the Ar+ laser annealing from the front surface and before metalllization, it is realized that the $CO_2$ laser annealing from the back surface has at least three different advantages thereover. As described hereabove, the Ar+ laser annealing permits beam transmission through the $SiO_2$ and strong absorption in the underlying silicon substrate at the interface. In contrast, the undesirable heating effects in the silicon which may result in the redistribution of dopant impurities are avoided by the back surface laser beam annealing step because the silicon does not absorb significantly at the desired laser wavelength. In addition, the strong absorption of the silicon dioxide and silicon nitride at the desired laser beam wavelength of the back surface approach provides a more effective anneal throughout the oxide layer of the insulator than does the diffusion of heat from the underlying silicon in the case of Ar+ laser annealing technique. Another significant advantage which may be considered over all the other annealing techniques described is the ability to perform the anneal as the last processing step on the completely fabricated metallized product. This ensures that the interface quality will not be degraded by a subsequent processing step like metallization.

Figure 5:
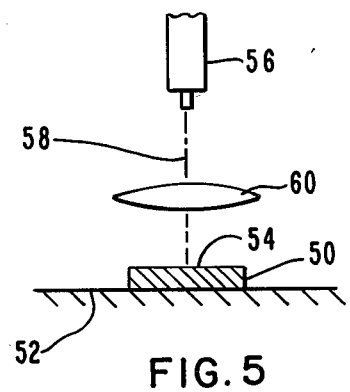
FIG. 5 is a simple block diagram illustration of the testing apparatus suitable for carrying out one aspect of the inventive method.

Preliminary experiments have been carried out using a $CO_2$ laser similar to the type manufactured by Photon Sources which may be used in either the pulsed or continuous wave (CW) modes. A simple illustration of the testing apparatus is shown in FIG. 5. A representative sample of a fabricated MNOS device is depicted by the block 50 resting on a conventional laser table 52 with the back surface 54 thereof positioned upright. The $CO_2$ laser 56 is controlled to focus its transmitted light beam 58 onto the back surface 54 of the fabricated device 50. A set of conventional lens and/or mirrors 60 may be utilized to guide the laser beam 58 to the surface 54. It is understood that, in certain instances, the illuminating area of the laser beam may be substantially smaller than the surface area of the semiconductor-insulator interface 22 (see FIG. 2). Under these conditions, the laser beam may be scanned across the surface area of the interface 22 to effect an overall annealing thereof. In one of the experiments performed, the laser beam was focussed to a 1 millimeter × 2 millimeter elliptical spot, and the laser power ranged from 30-60 W corresponding to power densities ranging from $4.8$–$9.6 \times 10^2$ W/cm$^2$ and laser pulse duration ranging from 3 milliseconds to 2 seconds.

Capacitance-voltage and capacitance/time measurements were performed on several samples before and after CO$_2$ laser annealing to determine the changes in interface state density, fixed oxide charge and generation lifetime. The results which are summarized in Table I shown herebelow, clearly indicate that the MNOS device properties may be significantly improved by the aforementioned laser annealing technique. The interface state density, $N_{st}$, is reduced in each case, the best result being obtained from sample No. 3, where a laser power density of $7.2 \times 10^2$ W/cm$^2$ and a pulse duration of 2 seconds yields an order of magnitude improvement and $N_{st}$, from $5.86 \times 10^{10}$ eV$^{-1}$cm$^{-2}$ before laser annealing to $6.6 \times 10^9$ eV$^{-1}$cm$^{-2}$ afterwards, without degrading the generation lifetime, $\tau_g$. The fixed oxide charge, $N_{ox}$, is also reduced, particularly in sample No. 3, where a laser power density of $6.4 \times 10^2$ W/cm$^2$ and pulse duration of 2 seconds reduces $N_{ox}$ from $1.59 \times 10^{11}$ cm$^{-2}$ to $9.87 \times 10^{10}$ cm.$^{-2}$. It is expected that furthr optimization of the annealing power density, annealing time, beam overlap and beam shape will lead to even more dramatic improvements in interface quality of MNOS devices.

thereafter, annealing said fabricated wafer by passing a laser beam through the semiconductor wafer from the back surface thereof to said semiconductor-insulator interface, said laser beam being of a wavelength which makes the semiconductor wafer substantially transparent and the insulator substantially absorbent to the laser beam to effect localized heating of the insulator at the semiconductor-insulator interface.

2. The process in accordance with claim 1 wherein an insulating layer of silicon dioxide is formed on one surface of a doped wafer of silicon to form an oxide-silicon interface which is annealed by the laser beam in the annealing step.

3. The process in accordance with claim 2 wherein said fabricated wafer is annealed by applying a CO$_2$ laser beam to the back surface of the wafer to be passed through the wafer to the semiconductor-insulator interface.

4. The process in accordance with claim 3 wherein the applied laser beam has a wavelength of approximately 10.6 μm.

5. The process in accordance with claim 1 wherein the annealing step is performed by applying a pulsed laser beam to the back surface of the wafer.

6. The process in accordance with claim 1 wherein the annealing step is performed by applying a continuous wave laser beam to the back surface of the wafer.

TABLE 1

| | | CO$_2$ LASER ANNEALING OF MNOS DEVICES | | | | | | |
|---|---|---|---|---|---|---|---|---|
| Sample Number | Laser Power Density ($10^2$ W/cm$^2$) | Pulse Duration | $N_{st}$ (ev$^{-1}$cm$^{-2}$) Before | After | $N_{ox}$ (cm$^{-2}$) Before | After | $\tau_g$ (μsec) Before | After |
| 1 | 9.6 | 3 msec | $3.79 \times 10^{10}$ | $9.55 \times 10^9$ | $1.26 \times 10$ | $1.09 \times 10^{11}$ | 2 | 1 |
|   | 9.6 | 3 msec |   | $1.25 \times 10^{10}$ |   | $1.03 \times 10^{11}$ |   | 0.6 |
|   | 9.6 | 1 sec |   | $1.7 \times 10^{10}$ |   | $1.09 \times 10^{11}$ |   | 8.3 |
| 2 | 4.8 | 1 sec | $3.05 \times 10^{10}$ | $1.31 \times 10^{10}$ | $1.31 \times 10^{11}$ | $1.23 \times 10^{11}$ | 9.4 | 4.6 |
|   | 6.4 | 2 sec |   | $2.47 \times 10^{10}$ |   | $1.3 \times 10^{11}$ |   | 2.3 |
| 3 | 4.8 | 2 sec | $5.86 \times 10^{10}$ | $3.59 \times 10^{10}$ | $1.59 \times 10^{11}$ | $1.5 \times 10^{11}$ | 7.2 | 0.7 |
|   | 7.2 | 2 sec |   | $6.6 \times 10^9$ |   | $1.32 \times 10^{11}$ |   | 7.2 |
|   | 6.4 | 2 sec |   | $9.7 \times 10^9$ |   | $9.87 \times 10^{10}$ |   | 0.07 |
|   | 5.6 | 2 sec |   | $1.28 \times 10^{10}$ |   | $1.34 \times 10^{11}$ |   | 4 |

We claim:

1. A process for fabricating metal-insulator-semiconductor integrated circuits including the steps of: forming an insulator layer on one surface of a doped semiconductor wafer rendering a semiconductor-insulator interface therebetween; forming metallic circuit paths on the top surface of said insulator layer; and 7. The process in accordance with claim 1 wherein the annealing step further includes the step of:
scanning the laser beam, which has an illuminating area substantially smaller than the surface area of the semiconductor-insulator interface, across the surface area of said interface to effect an overall annealing thereof.

* * * * *